US012670946B2

(12) United States Patent
Bennett et al.

(10) Patent No.: US 12,670,946 B2
(45) Date of Patent: *Jun. 30, 2026

(54) MONITORING AND MITIGATION OF ROW DISTURBANCE IN MEMORY

(71) Applicant: Microsoft Technology Licensing, LLC, Redmond, WA (US)

(72) Inventors: John Grant Bennett, Sammamish, WA (US); Stefan Saroiu, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 690 days.

This patent is subject to a terminal disclaimer.

(21) Appl. No.: 18/064,819

(22) Filed: Dec. 12, 2022

(65) Prior Publication Data

US 2023/0112352 A1 Apr. 13, 2023

Related U.S. Application Data

(63) Continuation of application No. 17/156,182, filed on Jan. 22, 2021, now Pat. No. 11,527,280.
(Continued)

(51) Int. Cl.
*G11C 11/4078* (2006.01)
*G11C 11/406* (2006.01)
(Continued)

(52) U.S. Cl.
CPC ........ *G11C 11/4078* (2013.01); *G11C 11/406* (2013.01); *G11C 11/4093* (2013.01); *G11C 11/4096* (2013.01)

(58) Field of Classification Search
CPC .............. G11C 11/4078; G11C 11/406; G11C 11/4093; G11C 11/4096
(Continued)

(56) References Cited

U.S. PATENT DOCUMENTS 5,812,490 A * 9/1998 Tsukude ................... G11C 7/22
365/230.03
11,527,280 B2 * 12/2022 Bennett ................. G11C 11/406
(Continued)

OTHER PUBLICATIONS

Office Action and Search Report Received for Taiwan Application No. 110146930, mailed on Jul. 25, 2025, 14 pages.
(Continued)

*Primary Examiner* — Connie C Yoha

(57) ABSTRACT

A memory device comprises a memory array, a counter unit, and a service unit. The memory array comprises cells arranged in rows and columns, wherein a subset of the cells in each of the rows holds a row activation count for each row. The counter unit, in response to an activation of the row caused by a read operation on at least a portion of the row, increments the row activation count for at least one of the rows prior to a completion of the read operation, and writes-back the row activation count in an incremented state to the subset of the cells in the row that held the row activation count prior to the activation. The service unit is coupled to the counter unit and performs a service with respect to one or more other rows, offset from the row, in response to the row activation count associated with the row satisfying service criteria.

19 Claims, 14 Drawing Sheets

100

Related U.S. Application Data

(60) Provisional application No. 63/070,213, filed on Aug. 25, 2020.

(51) Int. Cl.
*G11C 11/4093* (2006.01)
*G11C 11/4096* (2006.01)

(58) Field of Classification Search
USPC ......................................................... 365/149
See application file for complete search history.

(56) References Cited

U.S. PATENT DOCUMENTS

| | | | |
|---|---|---|---|
| 12,230,311 B2 * | 2/2025 | Gieske ................... | G11C 29/52 |
| 2019/0066808 A1 * | 2/2019 | Nale ..................... | G11C 11/406 |
| 2024/0273202 A1 * | 8/2024 | Zaidi ................... | G06F 12/1433 |
| 2025/0124964 A1 * | 4/2025 | Lu ..................... | G11C 11/40611 |

OTHER PUBLICATIONS

Notice of Allowance Received for Taiwan Application No. 110146930, mailed on Dec. 15, 2025, 04 pages. (English Translation Provided).

* cited by examiner

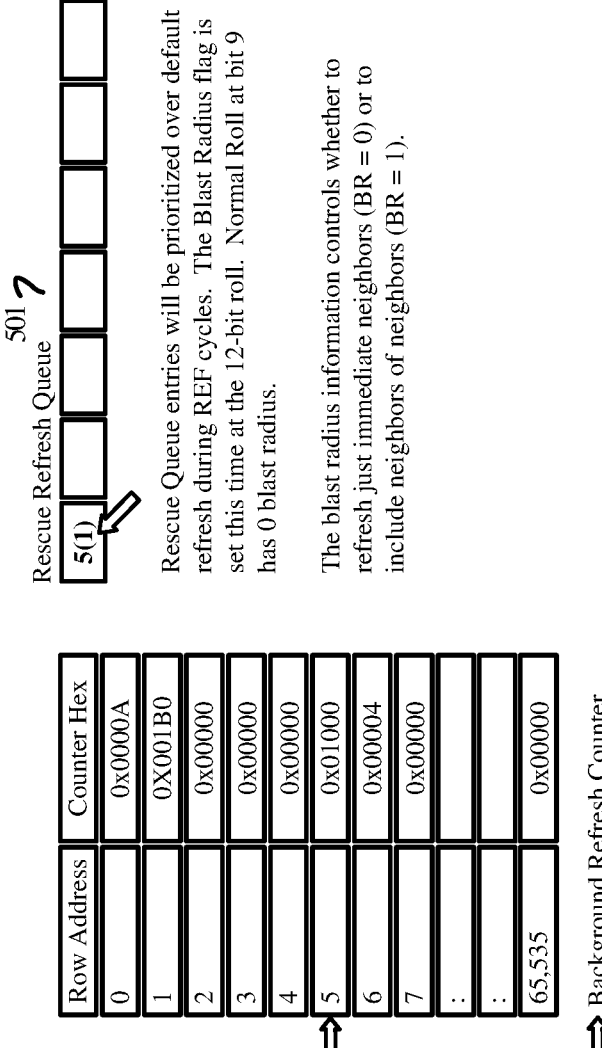

Rescue Refresh Queue

501

| 5(1) | | | | | | |

Rescue Queue entries will be prioritized over default refresh during REF cycles. The Blast Radius flag is set this time at the 12-bit roll. Normal Roll at bit 9 has 0 blast radius.

The blast radius information controls whether to refresh just immediate neighbors (BR = 0) or to include neighbors of neighbors (BR = 1).

| Row Address | Counter Hex |
|---|---|
| 0 | 0x0000A |
| 1 | 0X001B0 |
| 2 | 0x00000 |
| 3 | 0x00000 |
| 4 | 0x00000 |
| 5 | 0x01000 |
| 6 | 0x00004 |
| 7 | 0x00000 |
| .. | |
| .. | |
| 65,535 | 0x00000 |

⇧ Background Refresh Counter

Rescue Refresh Queue

| 5(1) | | | | | | |
|------|--|--|--|--|--|--|

On REF command

Aggressor count has been continuing. Each 0x200 roll added at 0x1200, 0x1400, and so on.

Here, 4 rows are refreshed around the aggressor row since the blast-radius flag indicates this should be a distance-2 rescue refresh.

| Row Address | Counter Hex |
|-------------|-------------|
| 0 | 0x0000A |
| 1 | 0X001B0 |
| 2 | 0x00000 |
| 3 | 0x00000 |
| 4 | 0x00000 |
| 5 | 0x01000 |
| 6 | 0x00004 |
| 7 | 0x00000 |
| .. | |
| .. | |
| 65,535 | 0x00000 |

Victim Refresh
of 8 rows
centered on
aggressor

500

MONITORING AND MITIGATION OF ROW DISTURBANCE IN MEMORY

RELATED APPLICATIONS

This application claims priority to U.S. Provisional Patent Application No. 63/070,213, filed on Aug. 25, 2020, entitled "Techniques for Mitigating Row Hammer Exploits," and U.S. patent application Ser. No. 17/156,182, filed on Jan. 22, 2021, entitled "Monitoring and Mitigation of Row Disturbance in Memory" which is hereby incorporated by reference in its entirety.

TECHNICAL FIELD

Aspects of the disclosure are related to the field of computer memory devices and sub-systems, and in particular, to exploit mitigation solutions for memory devices.

BACKGROUND

Dynamic random-access memory (DRAM) chips with small dimensions exhibit disturbance effects when operations on one row corrupt the values in adjacent or nearby rows. This creates both reliability and security problems, which have increased in severity as DRAM designs have shrunk. The security issues in particular have proven exceedingly difficult to solve and are serious concerns for DRAM vendors and users.

Solutions attempted to date include monitoring relatively small sets of high activity rows and interfering with instruction sequences that generate fast changes, but both approaches are unsatisfactory. For one, the algorithms used to detect limited samples of high activity can be circumvented by clever patterns. It is also difficult to block instruction sequences without having an adverse impact on valid high-performance programs. Additional complications include an industry desire to have a single, broadly effective solution so that DRAM remains a single commodity with broad markets.

BRIEF SUMMARY

Technical solutions disclosed herein mitigate the disturbance effects discussed above by storing row activation counts in their corresponding rows in memory, and refreshing rows when a given count satisfies established refresh criteria.

In an implementation, a memory device includes a memory array, a counter unit, and a service unit. The memory array includes cells arranged in rows and columns and a subset of the cells in each of the rows holds a row activation count for each row. The counter unit, in response to an activation of the row caused by a read operation on at least a portion of the row, increments the row activation count for at least one of the rows prior to a completion of the read operation. The counter unit also writes-back the row activation count in an incremented state to the subset of the cells in the row that held the row activation count prior to the activation.

The service unit is coupled to the counter unit and performs a service with respect to one or more other rows, offset from the row, in response to the row activation count associated with the row satisfying service criteria. For example, the service unit could refresh the row(s), copy, move the row(s), zero the row(s) or otherwise respond to the row activation count satisfying the criteria.

In some implementations, the service unit is a refresh unit that is coupled to the counter unit and that refreshes the one or more other rows, offset from the row, in response to the row activation count associated with the row satisfying refresh criteria. In this manner, attacks may be defended against by refreshing the values in rows targeted by an exploitation attack launched from an aggressor row.

This Brief Summary provides introduction to a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure may be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

FIGS. 5A-5G illustrate an operational scenario in an implementation.

DETAILED DESCRIPTION

Figure 1:
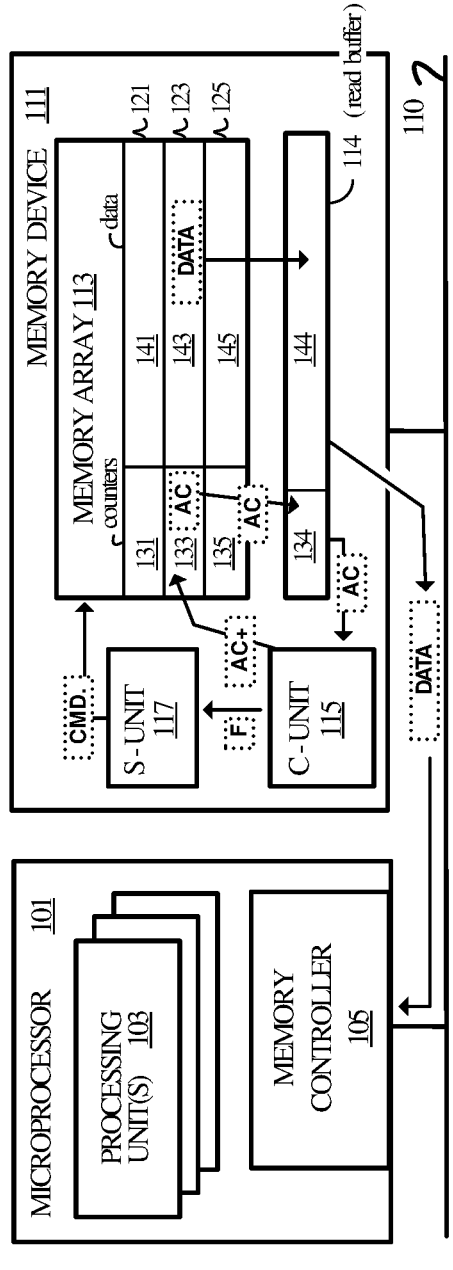
FIG. 1 illustrates a computing environment in an implementation of techniques for mitigating near-row disturbance effects.

Near-row disturbance effects in memory devices are projected to get worse as memory device shrink, threatening the secure operation of data center server fleets and challenging the ability of DRAM to scale. As discussed above, such effects can be leveraged maliciously to attack the integrity of data in one row of memory cells from adjacent or nearby rows, which are colloquially referred to as RowHammer attacks.

Such attacks use a row to serve as an aggressor row that is accessed repeatedly to cause a disturbance in the charge of its adjacent or nearby rows. The adjacent or nearby rows are considered victim rows targeted by the security exploitation. Such disturbances have the potential to change the actual values in the cells of the victim rows which can cause damage in the wider computing environment. For example, encryption keys, system parameters, or any other data may be scrambled, changed, or otherwise corrupted.

Several implementations are disclosed herein that seek to mitigate such attacks and other near-row disturbances. An approach is taken whereby row activation counts are maintained for the rows of cells in a memory array. As the rows are activated during read operations, their row activation counts are incremented. When the row activation account for a given row reaches a point where it satisfies service criteria, a service is performed with respect to one or more other rows offset from the given row. For example, the bits in the offset row(s) may be refreshed, relocated, or zeroed-out, which serve to defend against the disturbance effects emanating from the row being activated.

Counter units positioned close to, proximate to, or otherwise local with respect to the rows being activated increment the activation counts stored in the rows themselves. That is, each row includes additional cells that hold a certain number of bits that reflect the number of times the row has been activated. When the row is read, the bits stored in the additional cells are not sent to a host (as opposed to the other bits in the row), but rather remain on-board the memory device where they are incremented by a counter unit and written back into the row.

More specifically, reading a location in memory includes the steps of reading out an entire row to a row buffer. As disclosed herein, the entire row includes not only the requested bits, but also the counter bits stored in the additional (new) cells. The data bits in the buffer are sent to a host for processing, while the counter bits are provided to a counter unit to be incremented. However, all of the values in the row buffer must be written-back to the row in order to preserve their values because the act of reading out the values to the buffer flushes the row of its contents. The data bits as well as the incremented counter bits are therefore written back to the same row from which they were read.

A counter unit assigned to one or more rows increments the counts as the rows are activated. The counter unit is able to increment the count for a given row that has been activated within the timeframe that it takes for the data in the row to be read-out to a row buffer and written-back to the row. The count value is also read-out to the row buffer and the counter unit reads and increments the count value. The counter unit then writes-back the count to the row before or simultaneously with the remainder of the values in the row buffer.

In some implementations, the counter unit writes-back the count to the row buffer rather than to the row, so that the incremented count can be written-back to the row with the rest of the values in the row buffer. The speed of the incrementing is possible because the counter unit(s) is (are) positioned locally with respect to the cells of the memory array, as opposed to being positioned globally or at bank level, which would require wiring levels above the cell (typically 8 times wider than the cells, and thus 8 times more expensive).

More broadly, FIG. 1 illustrates a computing environment 100 in which the technology disclosed herein may be employed. Computing environment 100 includes microprocessor 101 and memory device 111 connected via channel 110, examples of which include a data bus, a memory bus, or any other suitable interface. Microprocessor 101 includes processing unit 103 and memory controller 105. Memory controller 105 includes various logic elements that provide control over the exchange of data between microprocessor 101 and memory device 111. Memory device 111 is representative of one or more random access memory (RAM) devices capable of storing program instructions and data, examples of which include dynamic random-access memory (DRAM) chips.

Memory device 111 includes memory array 113, read buffer 114, counter unit 115, and service unit 117. Memory array 113 includes cells arranged in rows represented by rows 121, 123, and 124. A subset of the cells in each of the rows holds a row activation count for each row, while the remainder of the cells hold data to be read out and sent to microprocessor 101. For example, row 121 holds an activation count in cells 131 and data in cells 141; row 123 holds an activation count in cells 133 and data in cells 143; and row 125 holds an activation count in cells 135 and data in cells 145. Read buffer 114 also includes cells 134 into which the activation count for an activated row is propagated, as well as cells 144 which hold the row's data bits.

In operation, a read request for a particular row causes the row to be activated. Its bits flow from its cells into the cells of row buffer 114. For instance, a read request for the data in row 123 causes the data in cells 143 to load into cells 144 of read buffer 114. The activation count stored in cells 133 also flows into cells 134 of read buffer 114. The data in cells 144 are then sent to microprocessor 101, while the bits in cells 134 that represent the row activation count (AC) are provided to counter unit 115.

Counter unit 115, in response to the activation of the row caused by the read operation, increments the row activation value represented by the bits in cells 134. Counter unit 115 achieves this step prior to the completion of the read operation and writes-back the row activation count in an incremented state to the subset of the cells in the row that held the row activation count prior to the activation. Continuing with the example read of row 123, counter unit 115 increments AC to AC+ and writes the value back into cells 133.

In some implementations, counter unit 115 performs an evaluation of the incremented activation count against service criteria. In such cases, counter unit 115 sets a flag (F) or other such signal to trigger service unit 117 to perform the service. In other cases, counter unit 115 provides the incremented value to service unit 117 to allow service unit 117 to evaluate the incremented count against the service criteria.

Service unit 117 is coupled to counter unit 117 and determines whether to perform a service on one or more other rows, offset from the activated row, depending upon whether the row activation count associated with the row satisfied the service criteria, as determined by either itself or counter unit 115. Service unit 117 may refresh, relocate, or zero-out the values in one or more rows adjacent to or nearby row 123 if the incremented activation count has met or exceeded a threshold. When this is the case, service unit 117 sends a command to memory array 113 and/or associated circuitry to implement the refresh, relocation, or other such service.

In some implementations, counter unit 115 includes incrementing circuitry that increments the row activation count, as well as alert circuitry that alerts service unit 117 that the row activation count for the row has satisfied the refresh criteria. The incrementing circuitry includes read circuitry that reads out the row activation count from row buffer 114, as well as adder circuitry that increments the row activation count by one or more. The incrementing circuitry also includes write-back circuitry that writes back the row activation count in an incremented state to the row from which it was read.

In some implementations, service unit 117 is a refresh unit that includes refresh circuitry that refreshes designated rows during refresh cycles. The refresh unit may also include tracking circuitry that stores an identity of each of the one or more other rows, and control circuitry that directs the refresh circuitry to refresh the one or more other rows on a next one of the refresh cycles.

In other implementations, service unit 117 may be capable of performing several services with respect to one or more rows when a row activation count satisfies one or more criteria. For example, service unit 117 could copy the data in the row to a new location or move the data altogether, as well as zero-out the values in the row. Such a service could be performed instead of—or in addition to—refreshing the neighboring row(s) and by a unit other than the refresh unit that performs the refresh, including a row copying unit, a row moving unit, and a row-zeroing unit. Thus, service unit 117 could in some implementations include multiple units tailored to their specific tasks. In fact, such a service unit could be employed to keep "hotter" rows of data physically closer to the row buffer than "colder" rows, the hotter rows being those accessed more frequently than other rows, or at a frequency higher than a threshold frequency (service criteria). Storing hotter rows closer to the row buffer would provide the technical effect of speeding up the DRAM.

Figure 2:
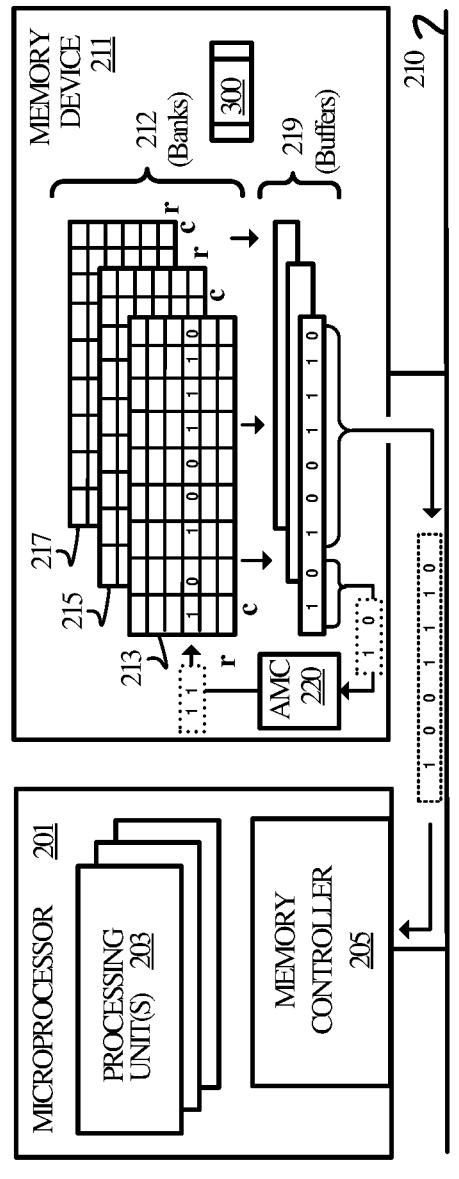
FIG. 2 illustrates a computing environment in another implementation of techniques for mitigating near-row disturbance effects.

FIG. 2 illustrates a computing environment 200 in another implementation that seeks to defend against RowHammer attacks. Computing environment 200 may be implemented in server computers, desktop computers, laptop computers, tablets, mobile devices, Internet of Things (IoT) devices, and the like. Computing environment 200 includes microprocessor 201 and memory device 211 connected via channel 210, examples of which include a data bus, a memory bus, or any other suitable interface.

Microprocessor 201 includes processing unit 203 and memory controller 205. Processing unit 203 is representative of one or more hardware elements that allow microprocessor 201 to execute instructions and process data. Examples of processing unit 203 include, but are not limited to: registers, program counters, arithmetic logic units, accumulators, and control units. Memory controller 205 is representative of one such control unit that governs the flow of program instructions and data between microprocessor 201 and memory device 211.

Memory controller 205 includes various logic elements that provide control over the exchange of data between microprocessor 201 and memory device 211. Operations conducted by memory controller 205 include, but are not limited to, refresh operations, read/write operations, interleaving, buffering, error checking and correcting (ECC) operations, and page open/close operations. Memory controller 205 may also govern memory bus initialization, characterization, and timing configuration during boot; read/set configuration registers in memory devices; and determine/adjust voltage levels, power levels, latency, and clock speeds. The logic governing such aspects of memory controller 205 may be implemented in control circuitry such as field-programmable gate array (FPGA) circuitry, application specific integrated circuits (ASICs), or other such integrated circuits.

Memory device 211 is representative of one or more random access memory (RAM) devices capable of storing program instructions and data, examples of which include dynamic random-access memory (DRAM) chips. Memory device 211 may be configured with one or more other memory devices to form a rank, which itself can be grouped with one or more other ranks to form a memory module (e.g., a dual in-line memory module, or DIMM). It may be appreciated that computing environment 200 includes only a single memory device for purposes of illustration, whereas most implementations would include multiple memory devices. In some implementations, memory device 211 includes a synchronous dynamic random-access memory (SDRAM) device implemented in accordance with a double data rate (DDR) memory protocol or any variation thereof such as DDR2, DDR3, DDR4, DDR5, LPDDR, GDDR. The techniques discussed herein also apply to other memory technologies and protocols and not limited to those disclosed herein.

DRAM chips are generally composed of large arrays of cells arranged in rows and columns, called word-lines and bit-lines respectively. DRAM also includes support circuitry for reading data out from the memory cells, writing data to the memory cells, and for refreshing the DRAM circuitry to maintain the integrity of the data. Memory cells include capacitors that are charged to store either a one or a zero. The support circuitry on a chip includes various elements that allow the ones and zeros to be written to or read from the memory cells such as sense amplifiers, row-address-select (RAS) logic, column-address-select logic (CAS), and read and write circuity. The circuitry also includes internal counters and registers to track refresh sequences and to initiate refresh cycles as needed.

Memory device 211 includes banks 212 of memory cells arranged in arrays of rows and columns, of which bank 213, bank 215, and bank 217 are representative. Each bank may include one or more arrays. Data is written into and read out from the rows of each of the banks 212 and into a corresponding one of buffers 219. That is, bank 213 corresponds to one of the buffers 219, while bank 215 corresponds to another, and so on. In the case of a read operation, data is moved into a buffer and then sent via memory controller 205 to processing unit 203. In the reverse, data is written out of microprocessor 201 to a buffer and then loaded into a row of cells.

The cells in the memory banks of memory device 211 are of the type that are susceptible to attacks that take advantage of the disturbance effects such as, but not limited to, dynamic random-access memory (DRAM), cross point memory, 3D cross point memory, and phase change memory. Memory device 211 includes attack mitigation circuitry (AMC) 220 to counter such disturbance effects. More specifically, the banks 212 of memory device 211 in FIG. 2 include additional columns in each row that are used to store an activation count for each row. The activation count is processed by AMC 220 to determine whether to refresh a given row above and behind normal refresh cycles.

Figure 3:
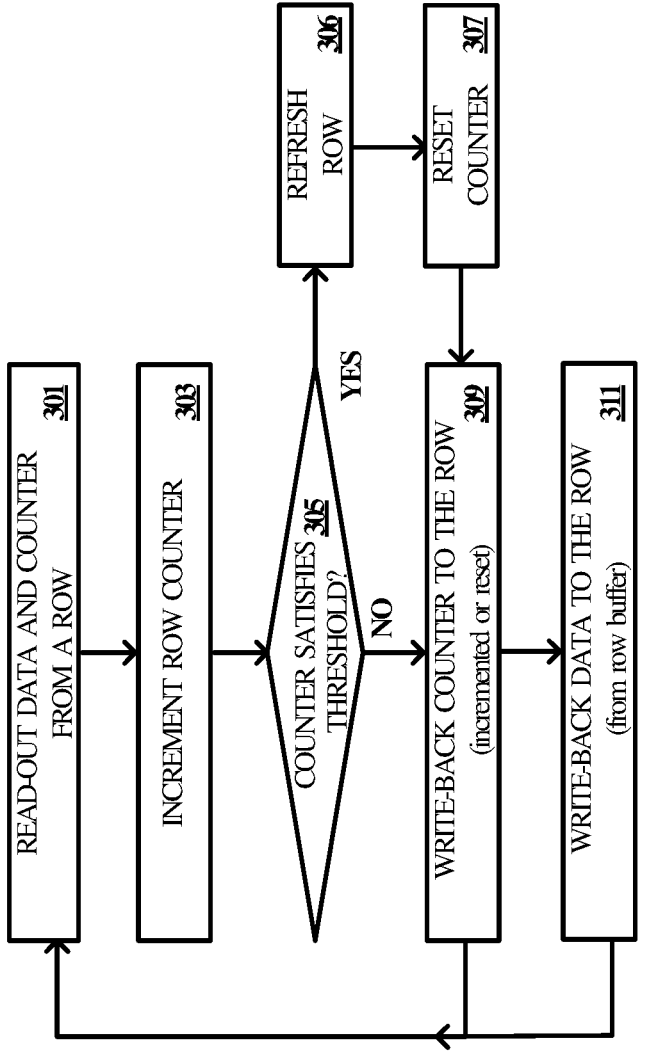
FIG. 3 illustrates a disturbance mitigation process in an implementation.
Figure 3:

Lastly, memory device 211 includes disturbance mitigation process 300, the details of which are illustrated in FIG. 3. Disturbance mitigation process 300 may be implemented in circuitry (e.g., flip-flop circuits) in the context of memory device 211, including AMC 220. The circuitry operates as follows, referring parenthetically to the steps illustrated in FIG. 2.

To begin, memory device 211 receives read and write instructions from memory 205 controller to read-out data from memory or write data to memory. To write to a memory cell, the row and column address for the cell is selected and data is presented at the data input pins. The chip's logic either charges or discharges the capacitor in a memory cell, depending on whether a one or a zero is to be stored. To read the data from a memory cell, the cell is selected by its row and column coordinates, the charge on the cell is sensed, amplified, and sent to the support circuitry, and the data is sent to the data output.

Paying particular attention to the read requests, each request pertains to a particular row of cells in a particular bank of memory. The row must be activated in order for the values in its cells to be transferred to one of buffer 219 and, from there, read-out to microprocessor 201. Memory controller 205 initiates a read operation with respect to a row of cells in memory by setting a voltage to signal open (high) on the row. Most of the bits in the row represent data destined for microprocessor 201, but a subset includes a row counter that tracks how many times the row has been activated since its last refresh. The voltage signal causes the data bits in the row to be read out to a row buffer and the counter bits to be read out to other circuitry capable of incrementing and evaluating the counter bits (step 301). The counter bits may be read out directly to the other circuitry in some implementations, thereby bypassing the row buffer. In other implementations, the counter bits may be read out to the row buffer and from there propagated to the other circuitry.

The bits destined for the processor are sent from the row buffer to cache memory on-board a processor, while the counter bits are incremented on-board the memory device (step 303). Under normal operating conditions, the data bits are written-back to the row, but before the write-back occurs, the circuitry evaluates whether the counter meets, exceeds, or otherwise satisfies a threshold (step 305). If the counter satisfies the threshold, then the subject row is refreshed (step 306) and the counter is reset (step 307). The counter is then written back to the row (step 309), whether it was reset or not, and the data bits are also written back to the row (step 311). As with the read process, the write-back process may involve writing the incremented counter bits directly to the row and bypassing the row buffer. Alternatively, the row buffer may be populated with the incremented counter bits so that the row in its entirety (the data bits and counter) can be written back to the row at the same time.

Figure 4:
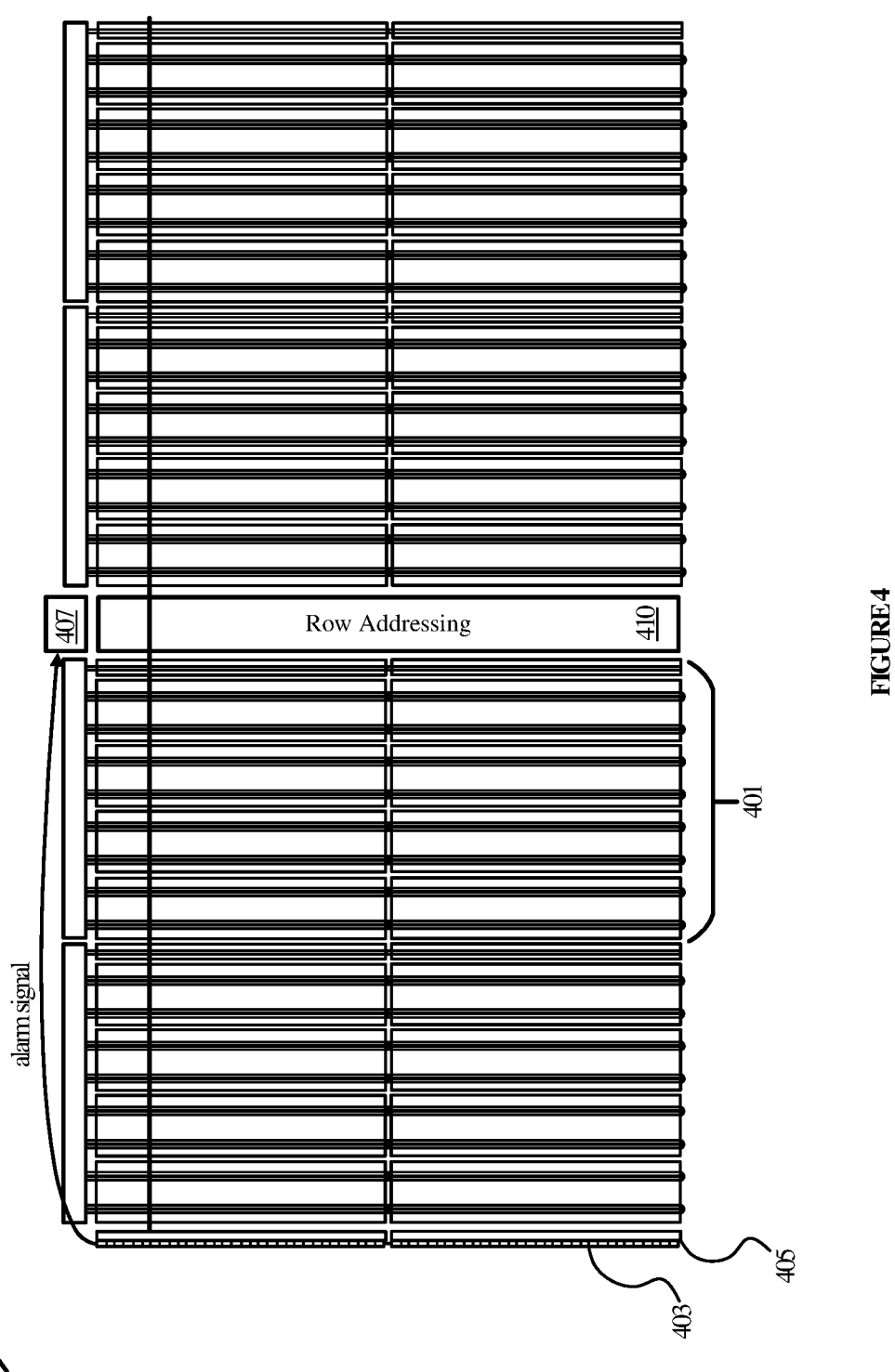
FIG. 4 illustrates a memory bank in an implementation.

FIG. 4 illustrates a memory bank 400 in an implementation. Memory bank 400 includes DRAM cells organized in arrays or mats 401. The cells are arranged in columns and rows meaning that addressing module 410 can address each cell by its row and column. Memory bank 400 is provided with incrementors 403 that increment a row activation count in column 405 each time a row of cells is accessed. The incrementors provides an alarm or alert signal to refresh logic 407 when the row activation counts meet or exceed a threshold. The refresh logic 407 can then refresh neighboring rows so as to mitigate against attacks.

A count is activated when any part of the same row is activated. Incrementing occurs only once per open row. The count is written back when the row is closed, which occurs naturally by driving the count value back into the column lines as soon as the increment is finished. In fact, this updates the count cells in the row with the incremented count before the row closes at the end of a read operation.

It may be appreciated that there are many more sub-arrays per bank than in this Figure. Assuming a bank is 512 M bits and a typical sub-array is 256 k bits, there will be 2,048 sub-arrays in each bank. It may be assumed that a bank is 32 sub-arrays wide with 8 k bits per global row (a row controlled by a single set of row-addressing logic), but different numbers might be in use by different vendors.

Figure 5A:
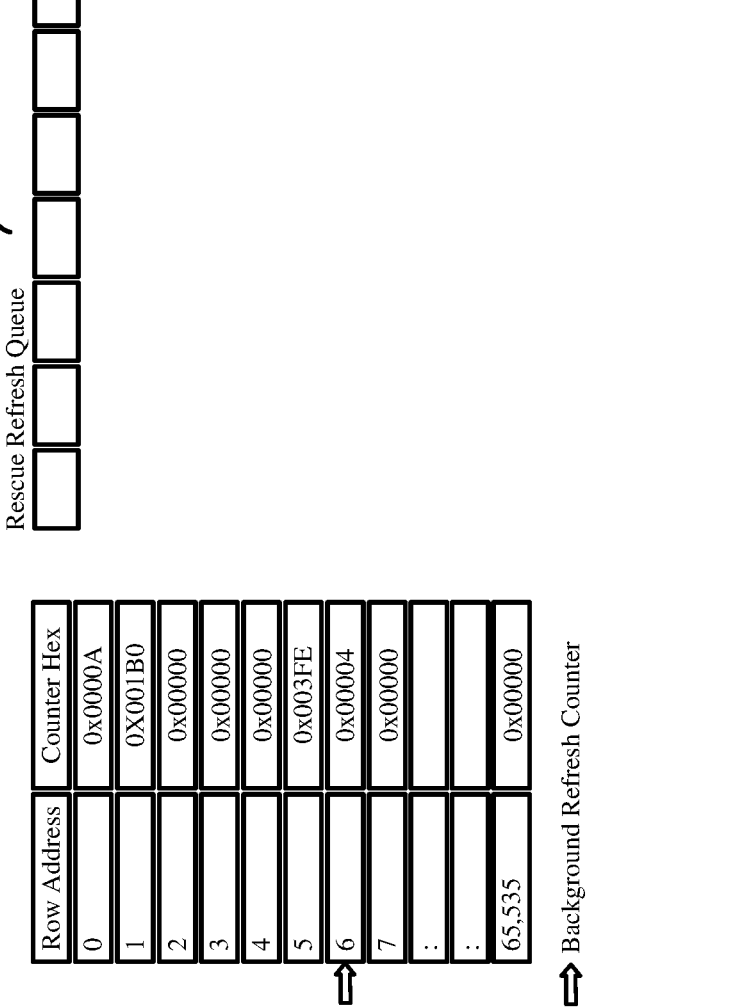
Figure 5A:
Figure 5B:
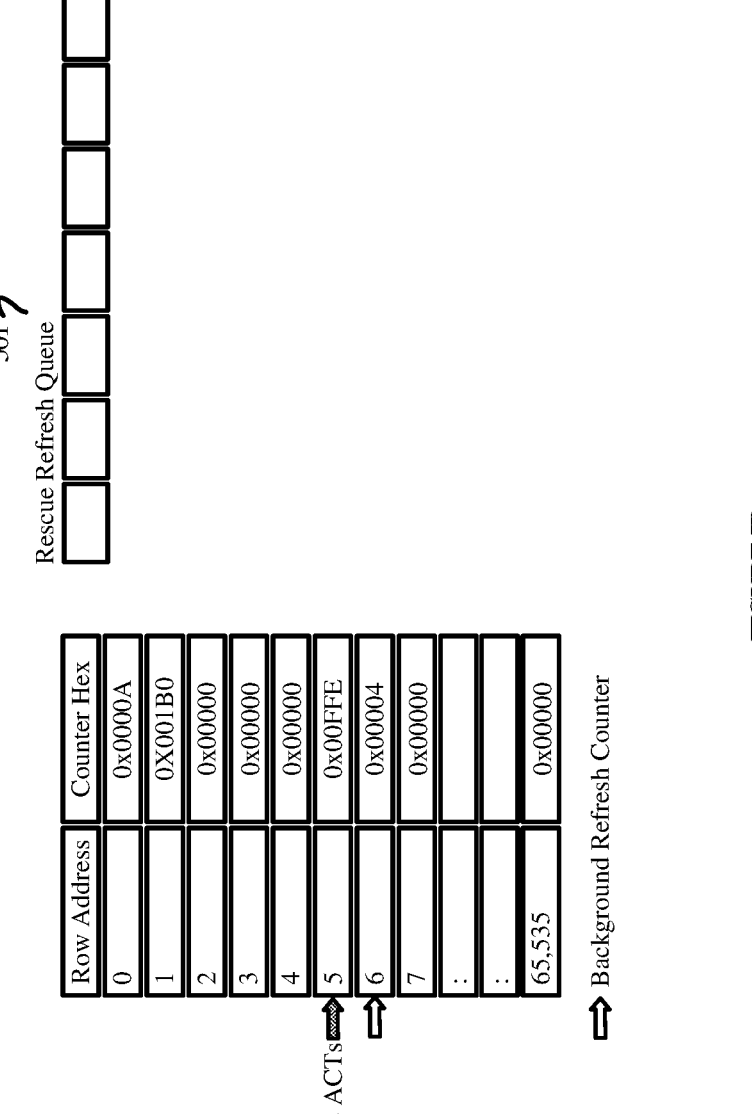
Figure 5B:

FIGS. 5A-5G illustrate various stages in an operational scenario 500 where the threshold is 512 activations for immediate neighbor rows and 4096 activations for second-level neighbors. In FIG. 5A, the rescue refresh queue 501 is empty, and the counter associated with row 6 in a memory array is 0x00004. Two activations of row 5 occur (FIG. 5B) which causes row 5's counter to increment from 0x003FE to 0x00FFE. Nothing happens yet though, as 0x00FFE remains below the threshold of 512 activations.

Figure 5C:
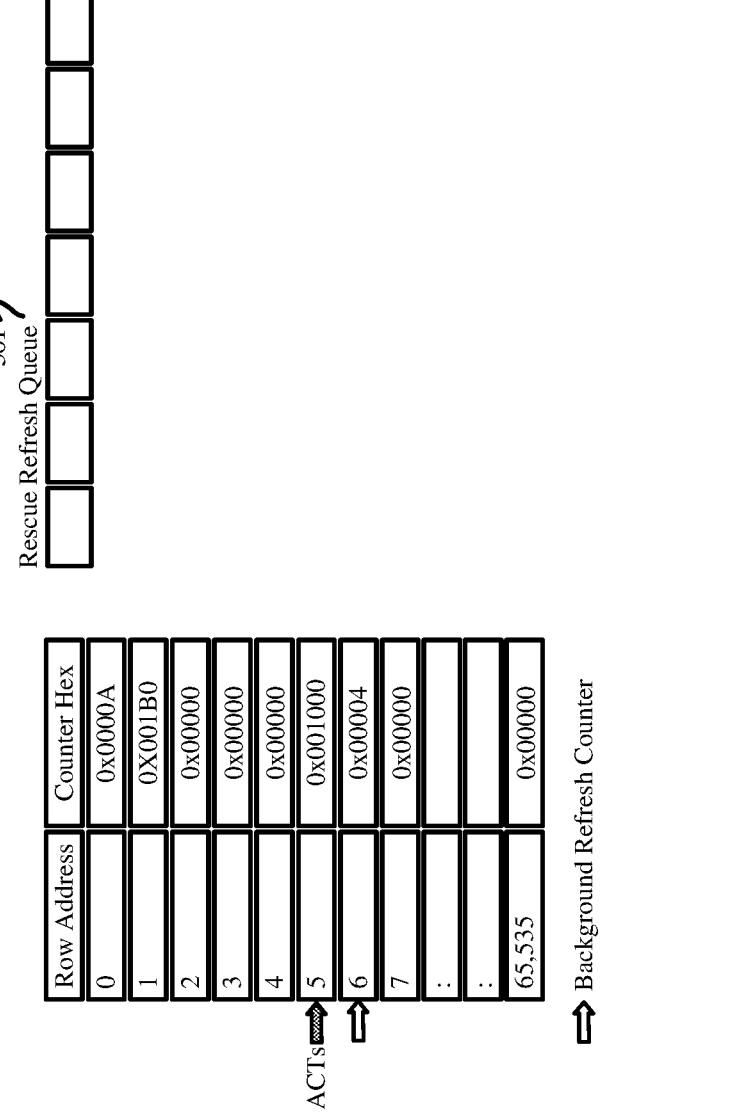
Figure 5C:
Figure 5D:
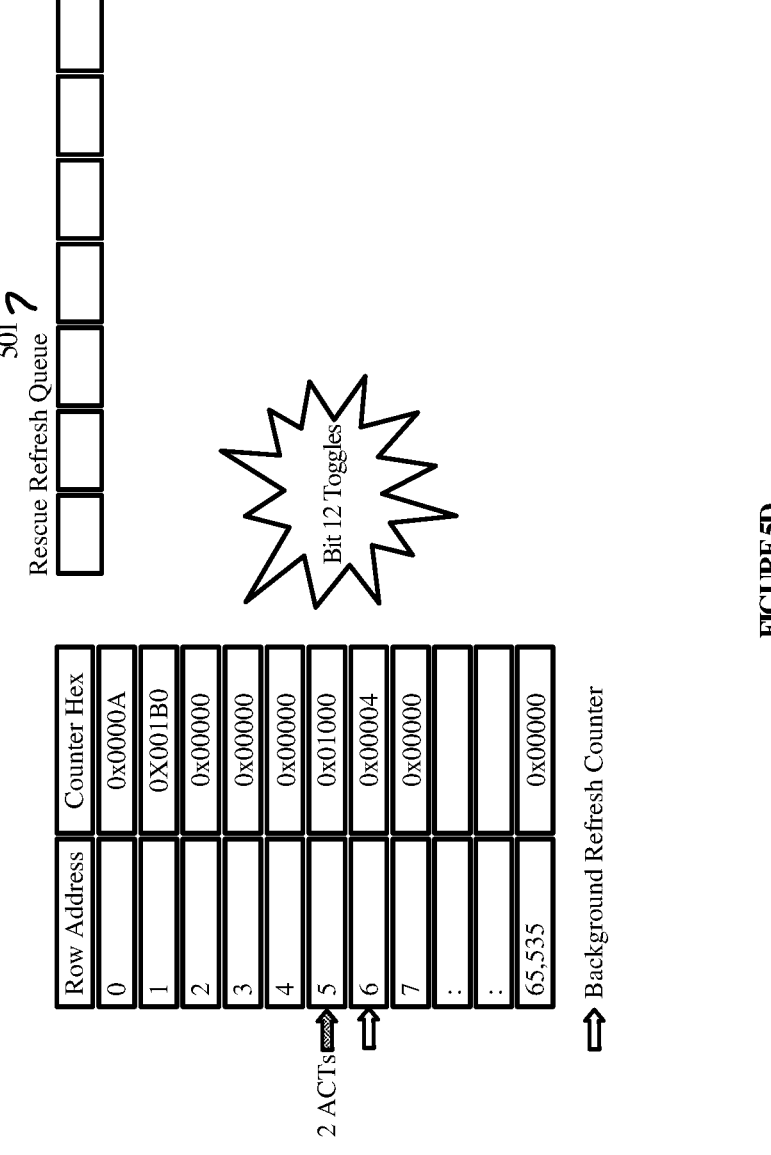
Figure 5E:
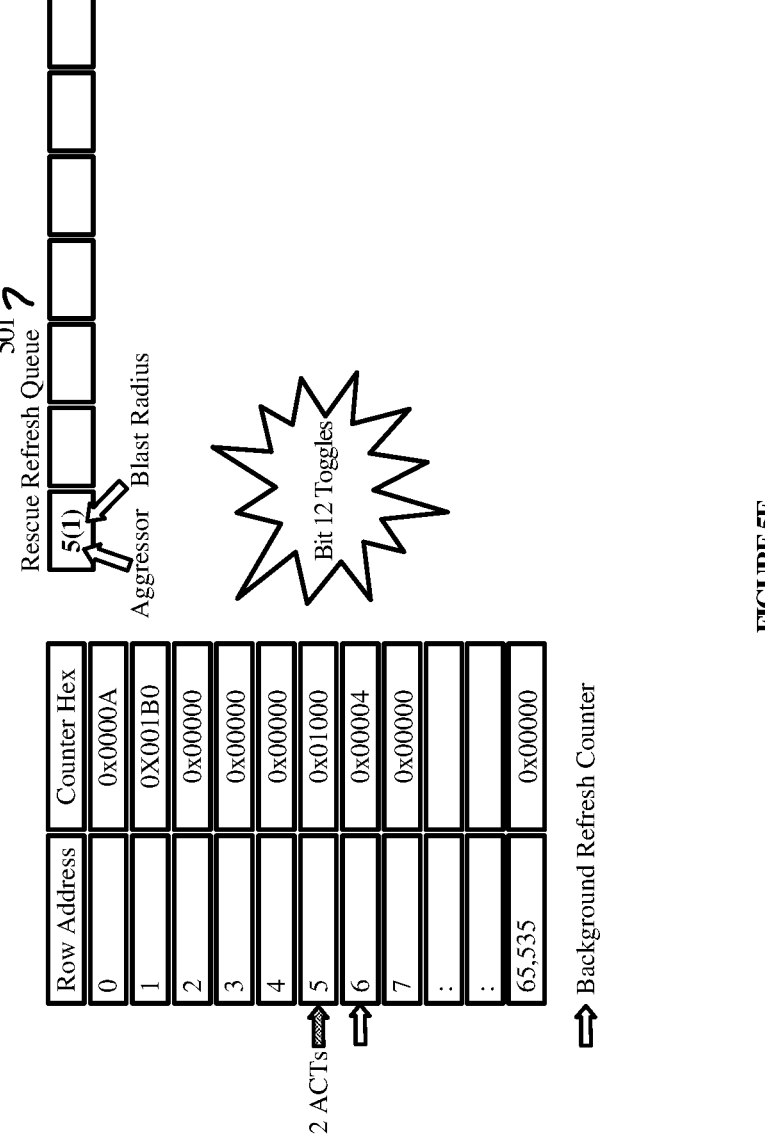

In FIG. 5C, two more activations occur, pushing the counter for row 5 to 0x01000. This causes bit 12 to toggle (FIG. 5D), which causes row 5 to be loaded into the rescue refresh queue as an aggressor row (FIG. 5E). In addition, a "blast radius" is stored in the queue. The blast radius is a number that controls whether to refresh just immediate neighbors or neighbors of neighbors. The blast radius may change based on the severity of an attack.

As explained in FIG. 5F, rescue queue entries will be prioritized over default refresh during refresh (REF) cycles. The blast radius flag is set this time at the 12-bit roll, whereas a normal roll at bit 9 has a 0-blast radius. As mentioned, the blast radius information controls whether to refresh just immediate neighbors (BR=0) or to include neighbors of neighbors (BR=1).

Figure 5G:
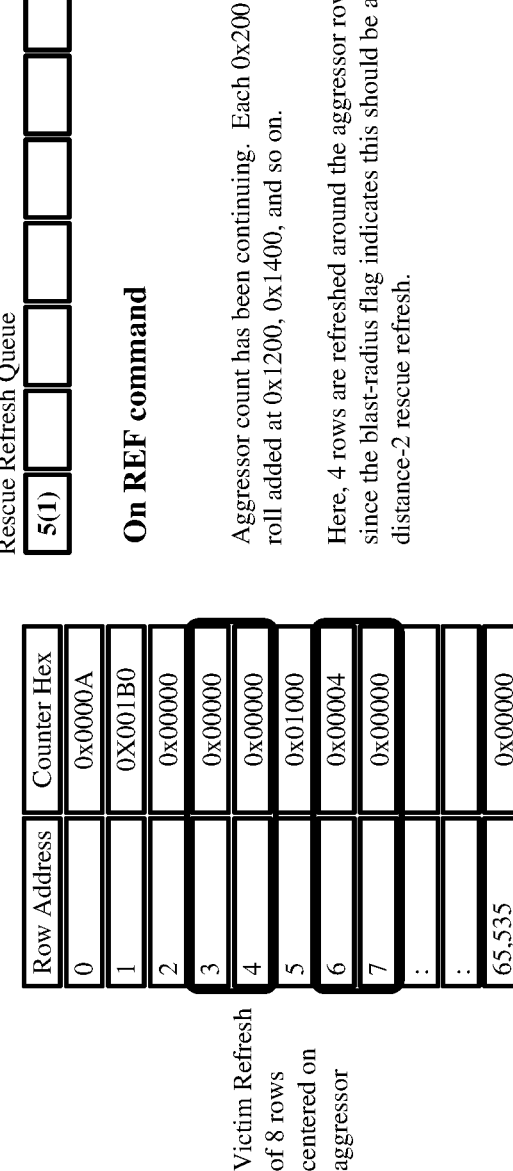

As explained in FIG. 5G, the aggressor count has been continuing. Each 0x200 roll added will be a future alarm. It will alarm at 0x1200, 0x1400, and so on. Here, 4 rows are refreshed around the aggressor row since the blast-radius flag indicates this should be a distance-2 rescue refresh.

Storing Counters in DRAM

Counts can be stored in a thin sub-array up to 16 bits or more wide, one per bank. A bank is typically 8 k bits wide, driven by a global row decoder. The decoder is being asked to add another 16 bits to that load (0.2%) which will be enabled on every access to that row.

The processing uses the read and writeback cycle inherent in DRAM activation. The value is incremented when each new activation occurs. The logic is implemented as a chain of 16 flip-flops which latch the data acquired when the row is activated. A single clock then toggles the flip-flops, cascading down the chain in a sequential adder. The result is then sent back from the flip-flops as updates to the counter cells. Driven by read, modify, write timing, the flip-flops roll over in under a nanosecond, so the values are returned the counter cells before even the shortest read cycle completes.

When values of selected bits transition from 1 to 0 (the carry-out which toggles the next flip-flop) a signal is sent to the refresh logic to enqueue the adjacent victim rows. Which bit does this depends upon the disturbance endurance of the technology—it could be when bit 9 carries-out (toggling bit 10), it could be when bit 11 carries-out (toggling bit 12). DRAM vendors can measure their cell performance and choose which bit shall drive the alarm.

Resetting Count Bits

Counters may free cycle—continue counting forever and wrap around at overflow—but may also reset to zero on every refresh cycle. If all counters free cycle this means that eventually all rows trigger alarms, which creates a background load of unnecessary rescues. If counts reset to zero at each refresh that would reduce the background load, but it would also make row counts predictable to aggressors. Free cycling of all rows is safer because it puts the DRAM into a randomized state where an aggressor cannot expect neighboring rows to be synchronized to support specially designed counting patterns. The counts will be random, drift with use, and cannot be observed externally.

The average rate of activation is up to 13 per default refresh per row. If zero bit 6 (worth 64 counts) is zeroed at refresh, then most typical rows will not toggle enough to pass the barrier. A few will, but the background rate will be low. On the other hand, any aggressor row creating interference will be cycling at hundreds or thousands of activations per cycle, so resetting bit 6 will not stop the counting of those and generating alarms when the carry-out bit is flipped. The rest of the bits will continue to count so the randomness will still be kept.

Bit 15 (the 16th bit) should be used as parity on higher bits (bits 7-14). When parity fails the incrementing should be suppressed. This prevents alarms being jammed "on".

Rescue Queue in Detail

The default refresh mode, all-banks refresh, is assumed here for exemplary purposes. For all-bank refresh assume 8 rows may be refreshed every 3.9 usec. In 3.9 usec a bank can be activated a maximum of about 100 times (40 ns per open/close cycle). In an overall refresh cycle of 32 ms there can be about 800 k activations at most within one bank.

When one or more aggressor rows are in the queue then victim-refresh takes priority over standard refresh. The first-in/first-out (FIFO) queue pushes out one aggressor row which is translated into a range of 8 centered on the aggressor, and that refresh burst runs instead of the standard one. Standard refresh resumes in REF cycles when the aggressor queue is empty.

With a 1024-count alarm threshold and maximum 800 k activations, only 800 signals can be generated per refresh cycle. There are 8,192 standard refresh operations per cycle, so that is about a 10% worst-case overhead, if all 800 k activations are aggressive.

Meanwhile, with at most 100 aggressive activations per REF and a count of 1,000 for rows with randomized counters, this is a queueing problem with a 10% arrival rate. Poisson distribution shows less than 1e-7 chance of 5 in the queue (overflowing a 4-deep FIFO) or less than 1e-14 of 9 (overflowing 8).

In contrast to SRAM or CAM, DRAM cells are abundant and inexpensive. This insight allows a design which tracks all rows. With this finite, modest investment this proposal completely eliminates RowHammer and related forms of adjacent-row disturbance.

Parity can be put on the counters. If a count has parity failing it is not incremented so it stops in a do-not-use state. Parity would be re-calculated and written back so transients would clear. Permanent faults will be extremely rare, likely less than 0.1 FIT per GB, although they can be mitigated by row replacement. The counter bits may also be laid out with slightly relaxed spacing and better reliability.

Very little power is consumed in the disclosed implementations. Activating 16 more columns is about 0.2% extra compared to the usual 8704 bits in a DDR5 activation and the cell access is only a small fraction of the total energy use on the chip. There will be a small load for the incrementor, which will only rarely cause a queueing operation. The queueing energy and row calculations are also quite small. No error correction control (ECC) overhead, no path outside the bank, and no off-chip movement occurs.

Since the counters wrap and never completely reset, they soon become random relative to each other. In any row refresh cycle time (tRFC) there are about 100 opportunities for activation. With a threshold of 1024 for an alarm, the chance of promoting one aggressor per tRFC is thus about 10%, which is a queueing problem with a 0.1 arrival rate. Arguably 2- or 4-entry queues would have safe overflow rates if no deliberate aggression was occurring. Using 8-entry queues creates a barrier which seems implausible for even a clever, determined aggressor to manipulate.

In some implementations, the actual RowHammer (disturbance) threshold could be multiples higher than the alarm threshold. That requires the aggressor to overflow the same row more than once while being unable to observe what is happening.

Various benefits and other technical effects may be appreciated from the present discussion, including that an adversary intent upon creating a disturbance cannot inspect counter values. In addition, counters have random values by the time adversary mounts the attack. Even if counters start with same initial value, they will quickly be out of sync. No externally visible event leaks information about the rows refreshed and an adversary doesn't know when a row is refreshed.

Count Processing in Detail

The counts can be stored in a thin sub-array 16 bits wide, one per bank. A bank is typically 8 k bits wide, driven by a global row decoder. The decoder is being asked to add another 16 bits to that load (0.2%) which will be enabled on every access to that row.

The processing uses the read and writeback cycle inherent in DRAM activation. The value is incremented when each new activation occurs. The logic is implemented in a chain of 16 flip-flops which latch the data acquired when the row is activated. A single clock then toggles the flip-flops, cascading down the chain in a classic sequential adder. The resulting value is then coupled back from the flip-flops into the columns, where it updates the counter cells in accordance with classic read, modify, write timing. The flip-flops roll over in under a nanosecond, so the values are back in the counter cells before even the shortest read cycle completes.

When values of selected bits transition from 1 to 0 (the carry-out which toggles the next flip-flop) a signal is sent to the refresh logic to enqueue the adjacent victim rows. Which bit does this depends upon the RowHammer endurance of the technology—it could be when bit 9 carries-out, it could be when bit 11 carries-out.

Bit 6 of the count will be zeroed by refresh cycles. This will minimize signals from rows with typical activity, and also has the effect of randomizing counts to inhibit overwhelming strategies. Bit 15 (the 16th bit) should be used as parity on bits 7 through 14. When parity fails the incrementing should be suppressed.

The disclosed solutions propose tracking aggressor rows and enqueueing victim rows' addresses. Assume when an aggressor row's count bit 9 transitions from 1 to 0 a signal is generated and so the aggressor row address is enqueued.

In a default refresh mode, all-banks refresh, although selective refresh modes are possible. All-bank refresh assumes 4 rows may be refreshed every 3.9 usec. In that period a bank can be activated a maximum of about 100 times (40 ns per open/close cycle). In an overall refresh cycle of 32 ms there can be about 800 k activations at most.

When there is one or more aggressor rows recorded in the queue then victim-refresh would take priority over standard refresh. The first aggressor row is translated into a range of 8 centered on the aggressor, and that refresh burst runs instead of the standard one, which will pause and resume when the aggressor queue is empty. The aggressor must force a discard from the FIFO in order to escape the alarm limit, allowing the victims to be unprotected for another cycle. This would need to be done for 2, 3 or more times in strict succession for the same row for disturbance to be achieved.

Figure 6:
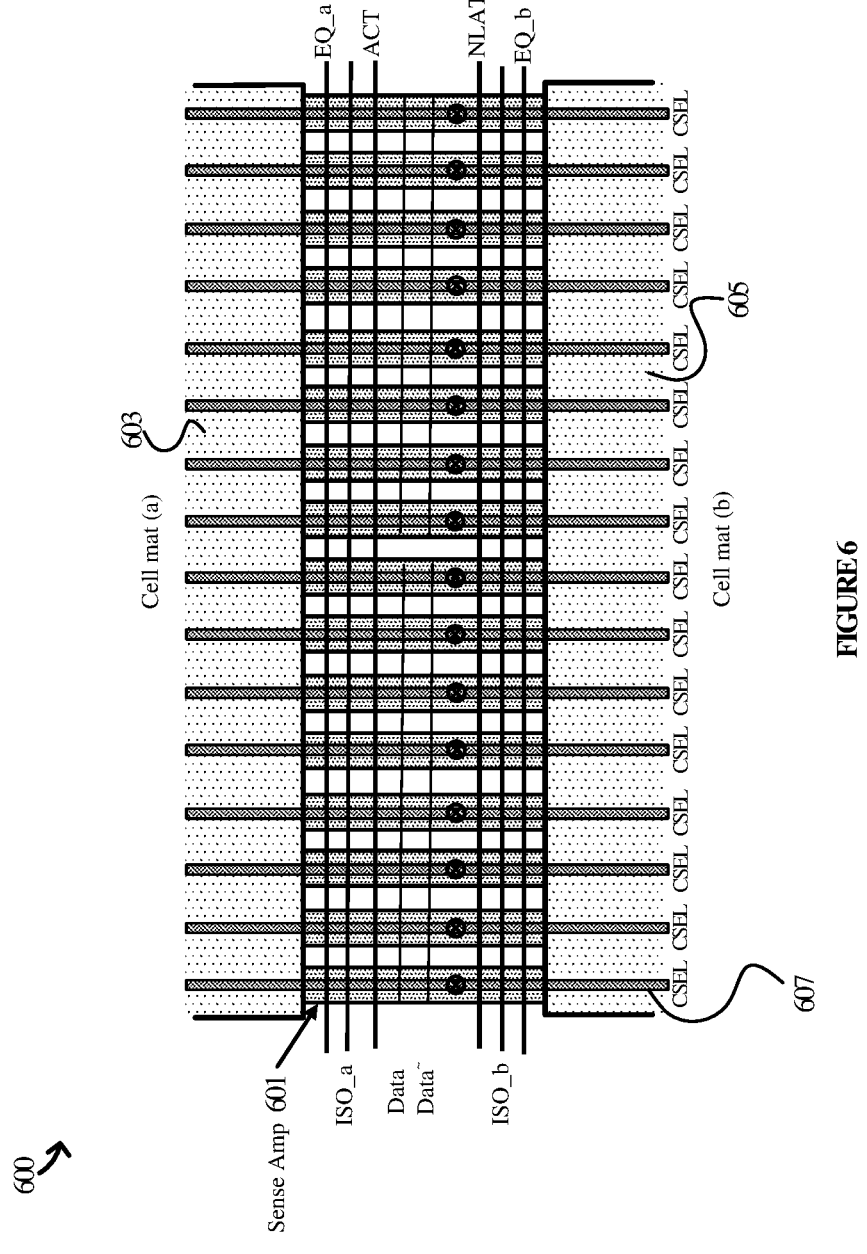
FIG. 6 illustrates a sense amp arrangement in an implementation.

FIG. 6 illustrates a sense amp arrangement 600. The sense amps 601 bridge between cell mats (sub-arrays) represented by cell mat 603 and cell mat 605. They can work with either the upper or lower arrays, which is decided by which mat is equalized (EQ_a or _b) and which mat is isolated from the SA (ISO_a or _b). The ACT and NLAT signals power and time the sense amp. The column selects 607 choose which out of each group of 8 will be connect up to the data line (which are wide, and not shown here, up in the metals).

Figure 7:
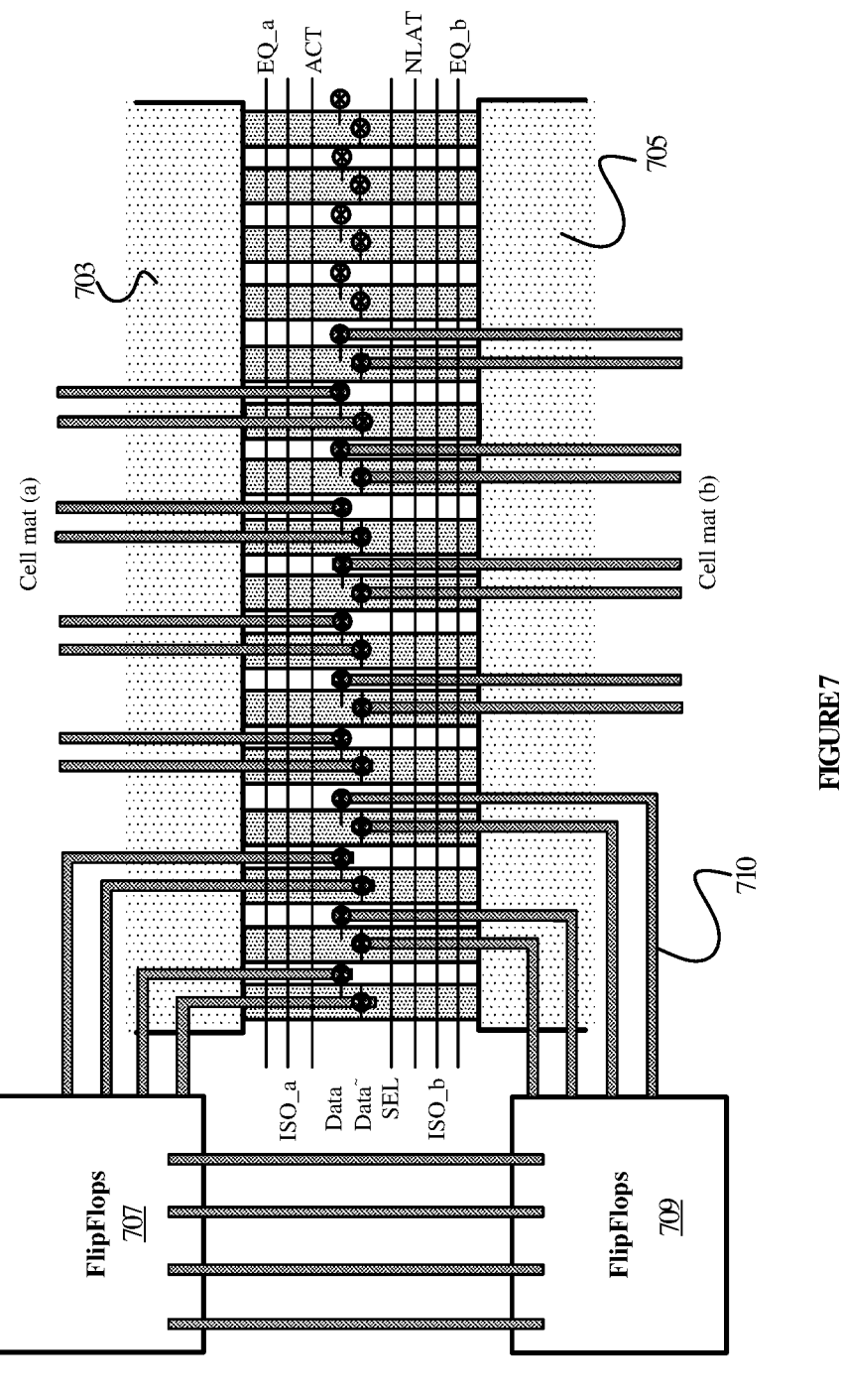
FIG. 7 illustrates a sense amp arrangement in an implementation.

FIG. 7 illustrates sense amp arrangement 700, which is rearranged for counters relative to sense amp arrangement

600. Sense amp arrangement 700 includes sense amps that bridge between cell mats 703 and 705. Sense amp arrangement 700 also includes flip-flops 707 and 709 connected to CSEL wires 710. The counters do not need long-line CSEL wires. That layer can be repurposed to connect to the counters, which will be located to the left. A single SEL line remains to control the timing of connecting to the counters. Only 12 bits per counter are needed. The control lines for the sense amps are the same as in adjacent sense amps for regular data, with the exception that a single SEL line will connect all 16 data lines and their complements.

Figure 8:
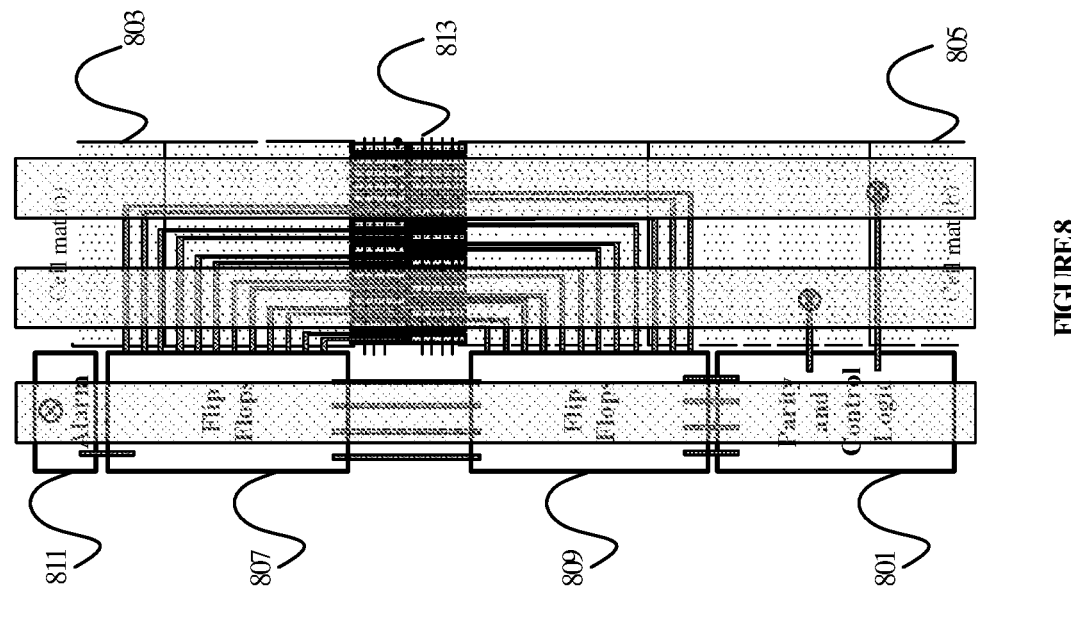
FIG. 8 illustrates a sense amp arrangement in an implementation.

FIG. 8 illustrates an arrangement 800 with counters and parity. The counters and parity bit, along with control logic 801, would be spread alongside the cell mats 803 and 805. If it is assumed that each flip-flop 807 and 809 is about 100× the size of a DRAM cell, and the mats are 16 DRAM cells wide, then 12 flip-flops will be as tall as about 200 rows of the mat. Each mat is over 512 rows so there is plenty of room to stretch flip-flops and logic along the side. A single alarm global line from alarm 811 pulses when the counter carries out. There should be space for a couple of global control lines which connect to control logic 801.

The sense amp area 813 is driven by the same lines as the sense amps for regular data, which will be immediately adjacent. Thus, those connections are not drawn here, and they borrow the existing logic. Some implementations utilize a side effect of row activation to mitigate attacks by adding 16 (or some other small number) extra cells on the row otherwise activated for reading or writing. While the main operation proceeds those side-bits can be processed through a counter and the nature of row activation allows the updated value to be put back into the side cells (even if the main operation is a read).

There is no access during that time to the neighboring rows. While this does leave some vulnerability to a double-sided attack, there are mitigations. First, this design allows relatively low counts to trigger alarm and neighbor refresh, so it can be low enough to cover a double-sided attack. Secondly the counters free cycle and drift out of alignment to the aggressor cannot be sure when each of the aggressor rows will cause alarm. It is, however, most important that a low enough alarm threshold is used and is usable.

In some implementations, there are some number of incrementors (counters) scattered close to the side bits but there is not one incrementor per row. A typical implementation would be that there is one incrementor for every row of sense amplifiers. Sense amplifiers are generally dual-sided and sandwiched between two sub-arrays, with the exception of the top and bottom subarrays which need one-sided sense amplifiers to complete their outside edges. Sub-arrays (aka "mats") are typically 512 rows high. Thus, there may be slightly more than one incrementor per 512 rows, as a typical implementation.

In some implementations, counter circuits are located near to the sense amplifiers for the subset of cells, wherein each one of the counter circuits performs the increment of activation counts which are in rows served by those sense amplifiers. The incremented value is returned to the sense amplifiers causing the subset of cells to be updated with the incremented count of activations.

In DRAM implementations, while a row is activated the sense amplifier is directly coupled to the cell in the active row. It senses the cell and drives toward the ideal state, dragging the cell with it. But they remain connected. A write operation then forces the sense amp to the desired state, possibly dragging the cell to the opposite state. The incrementor takes advantage of this to force the new count back out, regardless of whether the operation is read or write, and since it is close by it can do this fast enough to ensure the cells are dragged to the new count even if the overall operation is a read (which is a bit faster than a write).

Regarding alarms, a refresh unit directs the operation of refresh cycles upon the rows of memory. The counter circuit may alert the refresh unit that the current row has exceeded some threshold of counts. The refresh unit may remember the row identity and severity threshold for one or more rows, the alerted rows, so that in upcoming cycles given to refresh the neighboring rows of these alerted rows may be refreshed to erase any disturbance effects.

The counter unit may continue to count in an overall cycle, issuing the alerts at different severity as different bits roll over, refreshing larger sets of neighbors from the alerted rows with higher severity. The counter unit may also have the ability to zero one or more bits of the counter value upon a refresh cycle for a row, and the ability to do that zeroing only for normal refresh, not for rescue refreshes. The refresh unit may assign priority to victim refresh operations using normal refresh cycles so that no host intervention/cooperation is needed to provide extra "RFM" cycles. This is subtle but has benefits of making the scheme stronger (it is able to operate at much shorter intervals) and eliminates all side-channel information, becoming completely invisible to the host CPU/ASIC/SOC.

In some implementations, whenever a row is refreshed as part of background refresh only, one low-order bit in the counter could be set to 0 (reset). In an example, it is bit #5 (the 6th bit if bit numbering starts at '0'). This ensures that: 1) If a row receives a low rate of activates over time, its counter value is likely to stay under 64 (2^6). This means that no mitigation will ever be performed; and 2) If a row is under attack, resetting the low-order bit in the counter will not stop this counter from reaching the alarm threshold.

Various technical effects may be appreciated from the foregoing disclosure. The disclosed approach monitors every row in a memory array, for each of them keeping a count, and provides a solution that is cost-effective and transparent. The overhead is around 0.2% on memory area, a state machine in each bank, and up to a 10% increase in the length of all-banks refresh cycle under worst-case attacks—in some examples. No changes to DDR5 timings or specifications are required. The solution prevents attack strategies from avoiding detection by using patterns by virtue of the simplicity and completeness of the disturbance mitigation design.

Some additional features make the inner workings unpredictable, independent for every row, and unobservable from the outside so that attack algorithms cannot coordinate attacks on multiple rows. The mechanism can be implemented entirely within each DRAM chip at very low cost (probably less than 0.5%), with no impact to performance or power, allowing DRAM vendors to make the solution ubiquitous in a commodity market. There is little or no change to interface specs such as DDR5, LPDDR5, or GDDR6, so there is no burden on host chips and no need for redesign of applications which use DRAM. The elimination of disturbance effects allows DRAM parts to scale sooner. Thus, the benefits to data center operators, device manufacturers, and the like are that their most expensive commodity will have improved reliability, security, and future improvements in density while remaining a cost-effective commodity. While the discussion above refers to DDR5, it may be appreciated that the concepts apply as well to all types of DRAM including DDR (DDR5, DDR6, etc.), LPDDR, GDDR, HBM, and HCM.

In addition, the disclosed solution works from the assumption that it is possible to track the usage of every row, and to implement a mechanism which cheaply and efficiently generates a comprehensive rescue mechanism to all possible disturbance events. This is in contrast to approaches which try to identify subsets or special cases for defense. The proposed solution also includes a mechanism which does not subtract performance from the device nor requires any change to the interface specifications and operational modes of the DRAM chips, nor any new supporting features in host devices which are using the DRAMs.

The attack mitigation technology disclosed herein may be implemented in the context of any computing device, examples of which include, but are not limited to, server computers, desktop computers, laptop computers, tablet computers, mobile phones, watches and other wearable devices, and Internet of Things (IoT) devices.

In various implementations, there may be multiple incrementors distributed near to the counter cells so that the round trip write-back is faster than the process would be with a single incrementor distant from the rows, and where the only incrementor active is the one local to the row which is activated. All such incrementors for a bank may use a shared signal, such that the uniquely activated incrementor may use that signal if a transition occurs equal to an alarm value. In addition, the shared alarm signal may cause the identity of the activated row to be enqueued for the bank where the entries in the queue shall drive "rescue refreshes" of the neighboring rows.

Optionally, the alarm signal may be modulated to distinguish two or more different transition values causing the queue to include a value which represents the level of the alarm. The choice and number of neighbor rows to be refreshed can varies with the level of the alarm. In such a case, e a value in the queue may have the alarm level decremented upon action, removing the entry from the queue only when the level was zero, and returning it to the queue (front or back) when the value is not zero, such that multiple refresh cycles may act upon different neighbors while the refresh unit is constrained to a fixed timing.

An exemplary computing device includes, but is not limited to, a processing system, a storage system, software, a communication interface system, and a user interface system (optional). The processing system is operatively coupled with the storage system, the communication interface system, and the user interface system. The memory controllers disclosed herein may be implemented in the context of the processing system (e.g., CPU) or separately within an exemplary computing device.

An exemplary memory controller includes processing circuitry and non-transitory computer readable storage media readable by the processing circuitry and capable of storing firmware and associated parameters. The computer readable storage media may include volatile and nonvolatile media, removable and non-removable media, or any other method or technology for storage of information, such as computer readable instructions, data structures, program modules, or other data. Examples of the storage media include random access memory, read only memory, or any other suitable storage media. In no case is the computer readable storage media a propagated signal.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. A memory device comprising:
a memory array having cells arranged in rows and columns, wherein a subset of the cells in each of the rows holds a row activation count for each row;
a counter unit that:
in response to an activation of a row caused by a read operation on at least a portion of the row, increments the row activation count for at least one of the rows; and
writes-back the row activation count in an incremented state to the subset of the cells in the row that held the row activation count prior to the activation; and
a service unit, coupled to the counter unit, configured to, in response to the row activation count exceeding a threshold, refresh one or more rows based on an identity of the row indicated in a refresh queue and an offset value identified in the refresh queue, wherein the service unit comprises one or more of a row copying unit, a row moving unit, and a row zeroing unit, and performs a service comprising one or more of the row copying unit copying at least the row, the row moving unit moving at least the row, and the row zeroing unit zeroing-out at least the row.

2. The memory device of claim 1 wherein the row comprises an aggressor row in a security exploitation and wherein the offset value indicates a number of neighboring rows affected by the security exploitation.

3. The memory device of claim 2 wherein the service unit comprises a refresh unit and the counter unit comprises:
incrementing circuitry that increments the row activation count; and
alert circuitry that alerts the refresh unit that the row activation count for the row exceeds the threshold.

4. The memory device of claim 3 wherein the incrementing circuitry comprises:
read circuitry that reads out the row activation count from a row buffer;
adder circuitry that increments the row activation count by one; and
write circuitry that writes back the row activation count in an incremented state to the row from which it was read.

5. The memory device of claim 3 wherein the refresh unit comprises:
refresh circuitry that refreshes designated rows during refresh cycles;
tracking circuitry that stores an identity of each of the neighboring rows; and control circuitry that directs the refresh circuitry to refresh the neighboring rows on a next one of the refresh cycles.

6. The memory device of claim 1 wherein the cells in the memory array comprise dynamic random-access memory (DRAM) cells.

7. The memory device of claim 1 wherein the counter unit zeroes a bit of the row activation count of the row in response to a normal refresh of the row.

8. A method of operating a memory device, the method comprising:

reading and writing data to and from a memory array in the memory device, wherein the memory array comprises cells arranged in rows and columns, wherein a subset of the cells in each of the rows holds a row activation count for each row;

in a counter unit in the memory device, incrementing the row activation count for at least one of the rows in response to an activation of a row;

in the counter unit in the memory device, writing-back the row activation count in an incremented state to the subset of cells in the row that held the row activation count prior to the activation; and in a service unit coupled to the counter unit, refreshing, in response to the row activation count exceeding a threshold, one or more rows based on an identity of the row indicated in a refresh queue and an offset value identified in the refresh queue, wherein the service unit comprises one or more of a row copying unit, a row moving unit, and a row zeroing unit, and performs a service comprising one or more of the row copying unit copying at least the row, the row moving unit moving at least the row, and the row zeroing unit zeroing-out at least the row.

9. The method of claim 8 wherein the row comprises an aggressor row in a security exploitation and wherein the offset value indicates a number of neighboring rows affected by the security exploitation.

10. The method of claim 9 wherein the cells in the memory array comprise dynamic random-access memory (DRAM) cells.

11. A computing apparatus comprising:

a plurality of memory devices;

a controller that controls access to the plurality of memory devices;

wherein each of the memory devices comprises:

a memory array comprising cells arranged in rows and columns, wherein a subset of the cells in each of the rows holds a row activation count for each row;

a counter unit that:

in response to an activation of a row caused by a read operation on at least a portion of the row, increments the row activation count for at least one of the rows; and writes-back the row activation count in an incremented state to the subset of the cells in the row that held the row activation count prior to the activation; and a service unit, coupled to the counter unit, configured to, in response to the row activation count exceeding a threshold, refresh one or more rows based on an identity of the row indicated in a refresh queue and an offset value identified in the refresh queue, wherein the service unit comprises one or more of a row copying unit, a row moving unit, and a row zeroing unit, and performs a service comprising one or more of the row copying unit copying at least the row, the row moving unit moving at least the row, and the row zeroing unit zeroing-out at least the row.

12. The computing apparatus of claim 11 wherein the row comprises an aggressor row in a security exploitation and wherein the offset value indicates a number of neighboring rows affected by the security exploitation.

13. The computing apparatus of claim 12 wherein the service unit comprises a refresh unit and the counter unit comprises:

incrementing circuitry that increments the row activation count; and alert circuitry that alerts the refresh unit that the row activation count for the row exceeds the threshold.

14. The computing apparatus of claim 13 wherein the incrementing circuitry comprises:

read circuitry that reads out the row activation count from a row buffer;

adder circuitry that increments the row activation count by one; and write circuitry that writes back the row activation count in an incremented state to the row from which it was read.

15. The computing apparatus of claim 12 wherein the refresh unit comprises:

refresh circuitry that refreshes designated rows during refresh cycles;

tracking circuitry that stores an identity of each of the neighboring rows; and control circuitry that directs the refresh circuitry to refresh the neighboring rows on a next one of the refresh cycles.

16. An integrated circuit comprising:

a memory array comprising cells arranged in rows and columns, wherein a subset of the cells in each of the rows holds a row activation count for each row;

counter circuitry that:

in response to an activation of a row caused by a read operation on at least a portion of the row, increments the row activation count for at least one of the rows; and writes-back the row activation count in an incremented state to the subset of the cells in the row that held the row activation count prior to the activation; and refresh circuitry coupled to the counter circuitry that, in response to the row activation count exceeding a threshold, refreshes one or more rows based on an identity of the row indicated in a refresh queue and an offset value identified in the refresh queue, wherein the refresh circuitry comprises one or more of a row copying unit, a row moving unit, and a row zeroing unit, and performs a service comprising one or more of the row copying unit copying at least the row, the row moving unit moving at least the row, and the row zeroing unit zeroing-out at least the row.

17. The integrated circuit of claim 16 wherein the row comprises an aggressor row in a security exploitation and wherein the offset value indicates a number of neighboring rows affected by the security exploitation.

18. The integrated circuit of claim 17 wherein the counter circuitry comprises:

incrementing circuitry that increments the row activation count; and alert circuitry that indicates that the row activation count for the row has exceeded the threshold.

19. The integrated circuit of claim 18 wherein the incrementing circuitry comprises:

read circuitry that reads out the row activation count from a row buffer;

adder circuitry that increments the row activation count by one; and write circuitry that writes back the row activation count in an incremented state to the row from which it was read.

* * * * *